United States Patent [19]

Dreibelbis et al.

[11] Patent Number: 4,653,681
[45] Date of Patent: Mar. 31, 1987

[54] VOICE COIL ACTUATED FINE WIRE CLAMP

[75] Inventors: John D. Dreibelbis, Chalfont, Pa.; David S. Pechter, Trenton, N.J.; Philip J. Bernosky, Elkins Park, Pa.

[73] Assignee: Kulicke and Soffa Industries, Inc., Willow Grove, Pa.

[21] Appl. No.: 734,691

[22] Filed: May 16, 1985

[51] Int. Cl.$^4$ .................. B23K 37/00; B23K 31/02
[52] U.S. Cl. ............................... 228/4.5; 228/8; 228/102; 228/103; 228/56.5
[58] Field of Search ............... 228/4.5, 8, 102, 103, 228/56.5

[56] References Cited

U.S. PATENT DOCUMENTS

| | | | |
|---|---|---|---|
| 4,202,482 | 5/1980 | Sade et al. | 228/4.5 |
| 4,445,633 | 5/1984 | Bouham, Jr. | 228/9 X |
| 4,475,681 | 10/1984 | Ingle | 228/4.5 |
| 4,485,957 | 12/1984 | Sugimoto et al. | 228/10 X |

FOREIGN PATENT DOCUMENTS 193038 11/1984 Japan .................................. 228/904

Primary Examiner—Nicholas P. Godici
Assistant Examiner—Carmine Cuda
Attorney, Agent, or Firm—John B. Sowell

[57] ABSTRACT

A high speed low inertia fine wire clamp is provided for automatic wire bonders of the type which move the bond head and bond head frame relative to the workstation which supports the semiconductor device to be wire bonded. The wire clamp comprises a fixed clamp lever mounted on a bond head link and a movable lever which is pivotally mounted on the fixed wire clamp lever. The wire clamp jaws of the wire clamp levers are spring biased to a normally closed position and are moved relative to each other by a voice coil motor mounted on the wire clamp levers and controlled by a microprocessor to apply predetermined forces on the wire between the wire clamp jaws and to monitor the distance between the jaws.

16 Claims, 6 Drawing Figures

FIG. I

VOICE COIL ACTUATED FINE WIRE CLAMP

BACKGROUND OF THE INVENTION

1. Field of the Invention

The present invention relates to wire clamps for wire bonders and more particularly to a low inertia high speed voice coil driven wire clamp for use with an automatic wire bonder.

2. Description of the Prior Art

Automatic wire bonders are commercially available which provide different combinations of movable bonding heads and/or movable workstations. U.S. Pat. No. 4,266,710 shows a high speed vertically movable bonding head on an automatic ball wire bonder which cooperates with a workstation mounted on a movable X-Y table. Kulicke and Soffa Industries, Inc. of Horsham, Penna. sells a model 1482 automatic ball bonder in which the bonding head is mounted on an X-Y table.

The problem with moving the bonding head on an X-Y table is that the forces of acceleration in such high speed automatic wire bonders reach up to seven times the force of gravity. These extreme forces when imparted to the existing type of wire clamps shown in the aforementioned U.S. Pat. No. 4,266,710 cause changes in the clamping force as well as time required to open and to close the wire clamps which affects the consistency of the fine wire interconnection during a complete bonding operation. The forces may become so severe as to cause distortions in the loop trajectory and may also result in damage to the fine wire. It has been discovered that these problems result from either excessive or lack of proper wire clamp forces. Heretofore, it has been possible to slow down the speed of the X-Y table to reduce the forces of gravity which cause the aforementioed problems. However, such remedies are inconsistent with higher production rates and commercial requirements for automatic wire bonders.

It would be desirable to provide a low inertia high speed wire clamp which is not affected by the acceleration forces of a high speed X-Y table.

SUMMARY OF THE INVENTION

It is a primary object of the present invention to provide a low inertia fine wire clamp which is operable at high speeds having programmable clamping forces which are substantially unaffected by acceleration forces up to ten times the force of gravity.

It is another principal object of the present invention to provide a novel fine wire clamp which enables the gap in the jaws of the wire clamp to be programmed by a control processor.

It is another object of the present invention to provide a novel fine wire clamp having a gap probe for monitoring or continuously measuring the gap in the jaws of the wire clamp during a bonding operation.

It is yet another object of the present invention to provide a novel voice coil actuated motor for a novel wire clamp which accurately applies a force to the wire clamp jaws as a function of current.

It is another object of the present invention to provide a novel voice coil actuated wire clamp which may be programmed from a remote computer or a remote location to permit the novel wire clamp to be used with a factory automation system.

It is yet another object of the present invention to provide a novel voice coil actuated wire clamp that does not require manual adjustment when the wire size is changed in the automatic wire bonder.

It is yet another object of the present invention to provide a novel wire clamp structure which can be opened wider than normal to allow easier feeding of the wire to the bonding tool.

It is yet another general object of the present invention to provide a novel wire clamp mechanism provided with a proximity probe for indicating the size of the wire in the gap of jaws of the wire clamp.

In accordance with these and other objects of the present invention to be explained in detail hereinafter, there is provided a low mass low inertia voice coil actuated wire clamp for use in a high speed automatic wire bonder having an X-Y table for positioning a bonding head which comprises a movable bonding tool. A first wire clamp lever is fixedly mounted on the bonding head. A second wire clamp lever is pivotly mounted on the first wire clamp lever and supports the low mass components of the voice coil motor and one of the jewels of the wire clamp jaws. The movable low mass lever is balanced about the pivot point so as to reduce the effect of acceleration forces imparted thereto by movement by the X-Y table.

DESCRIPTION OF THE PREFERRED EMBODIMENT

Figure 1:
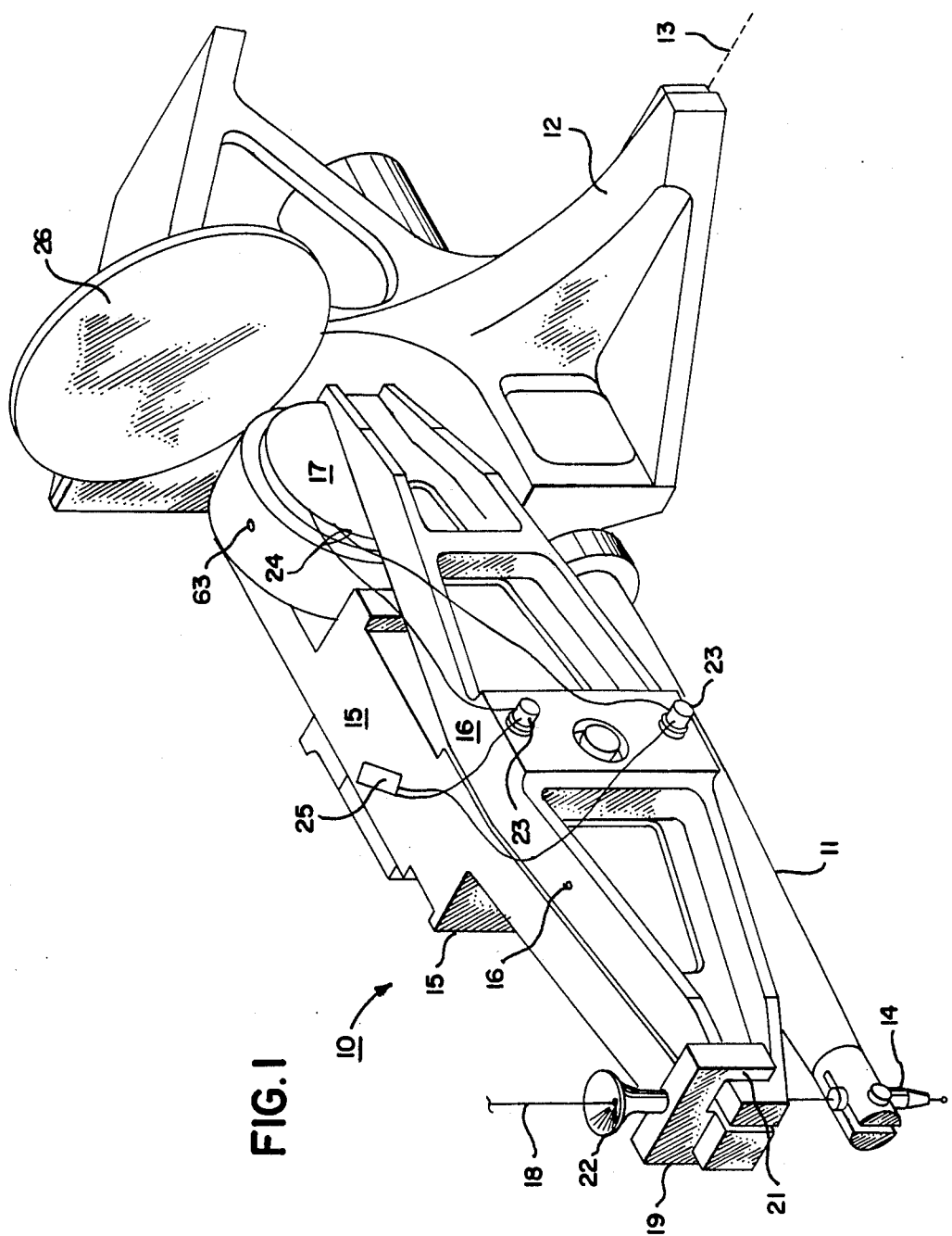
FIG. 1 is an enlarged isometric view showing the present invention wire clamp mounted on a bonding head link of an automatic wire bonder.

Refer now to FIG. 1 showing a preferred embodiment wire clamp 10 and a transducer 11 mounted on a bond head link 12. The bond head link 12 is adapted to pivot an axis 13 to impart vertical or Z-motion to the bonding tool 14 clamped in the end of transducer 11. The wire clamp 10 comprises a first fixed lever 15 mounted on the bond head link 12 and a second moving lever 16 pivotally mounted on lever 15. A low mass voice coil 17 is mounted on the moving lever 16 close to the pivot axis 13. The opposite end of lever 16 is moved to clamp the fine wire 18 against the end of fixed lever 15 as will be explained in detail hereinafter. A wire clamp stop 19 is fixed to the end of lever 15 and is provided with a downward extending finger 21 which cooperates with the moving end of lever 16 to limit the excursion of the moving lever. Wire guide funnel 22 is mounted through wire clamp stop 19. Insulating terminals 23 are carried in apertures in lever 16 and provide mechanical support for electrical connecting wires 24 connected to the coil 17. Terminals 23 also provide a stable connecting point for the harness 25 which interconnects to the driving amplifier to be described hereinafter. A steel target 26 is mounted on bond head link 12 to provide a suitable sensing surface for the Z-axis sensing proximity which will be also be described hereinafter.

Figure 2:
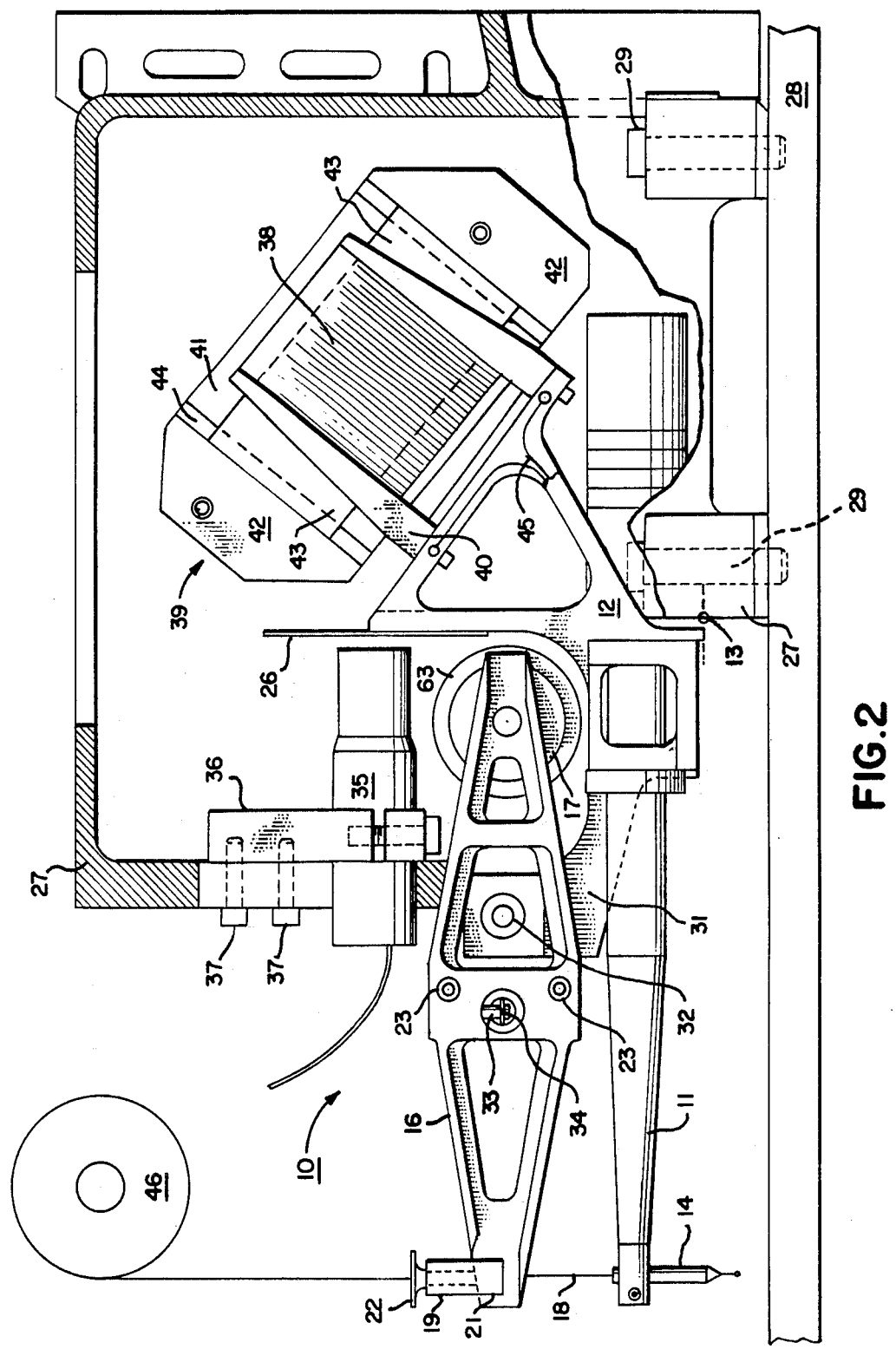
FIG. 2 is a side elevation in partial section showing the wire clamp of FIG. 1 mounted on a bond head frame which is adapted to be mounted on an X-Y table of an automatic wire bonder.

Refer now to FIG. 2 showing the wire clamp 10 in side elevation and the bond head link 12 mounted on a bond head frame 27 which is adapted to be mounted on the X-Y table 28 by means of socket head screws 29. The bond head link which supports the transducer 11 and wire clamps 10 thereon pivots about pivot axis 13 which is provided by a cross pivot spring of the type known in the prior art. An upward extending arm portion 31 on link 12 provides a support for fixed lever 15 attached thereto by socket head screw 32. A spring support pin 33 in movable lever 16 provides a support for spring 34 which connects to a pin on fixed lever 15 for holding the levers 15 and 16 together on their ball pivots and also provides a small closure force at the clamp ends against the fine wire 18 as will be described in more detail hereinafter. A Z-axis position proximitor 35 is mounted on bond head frames 27 by means of a spit yoke proximitor mounting block 36 held to the frame by socket head screws 37. As will be explained hereinafter the steel target 26 is moved relative to the proximitor when the bond head link 12 is moved about pivot axis 13.

The coil 38 of a novel linear motor is mounted on hollow coil frame 40 which is fixed to the bond head link 12. Movement of the linear motor coil 38 imparts a pivotal movement to bond head link 12 and parts mounted thereon. The magnetic cooperating field for coil 38 is provided by a linear motor magnet assembly 39 which is mounted on frame 27. Assembly 39 comprises a plurality slab magnets 41 which cooperate with an end pole pieces 42, an inner pole piece 43 and a pair of outer poles pieces 44. The inner pole piece 43 extends through the hollow coil frame 40 which supports the linear motor coil 38. The aforementioned pole pieces 42, 43 and 44 provide a flux passage for the magnetic field of the slab magnets 41. It will be understood that power applied to leads 45 of the coil 38 will impart a pivotal movement to the bond head link 12 causing the bonding tool 14 to move in a substantially vertical direction. The operation of the linear motor 38-44 is independent of the operation of the voice coil motor 17 and does not affect the operation of the wire clamp 10. However, the movement of the bonding tool 14 downward with the wire clamp 10 closed will pay out wire 18 from spool or wire supply 46.

Figure 3:
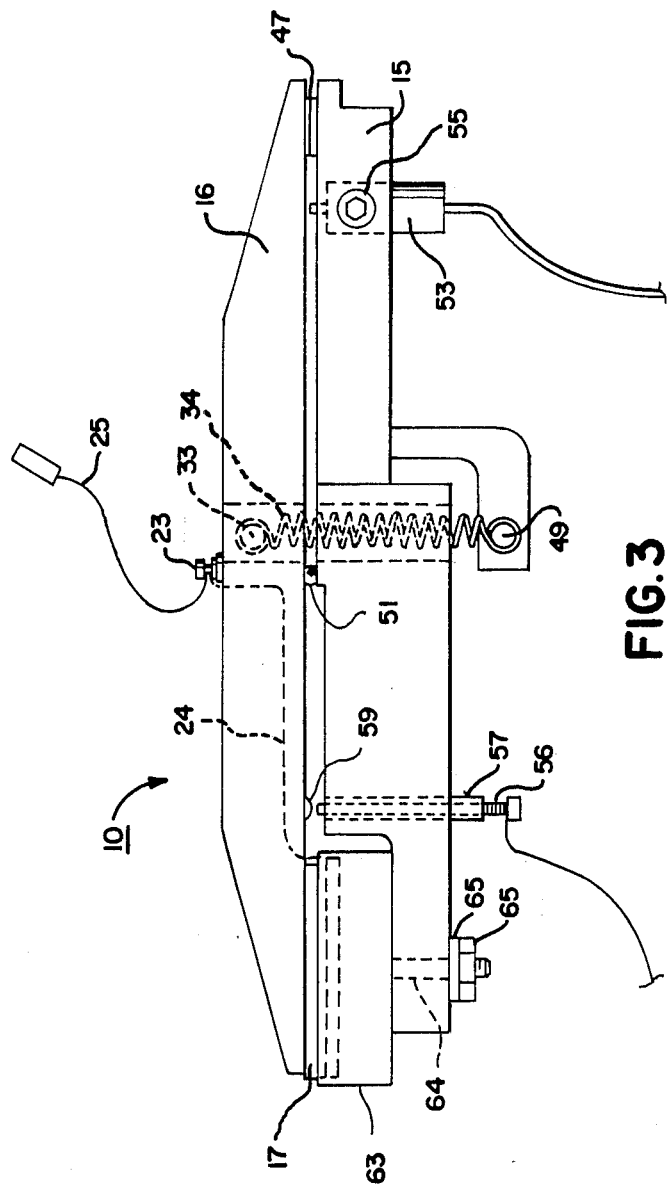
FIG. 3 is a top or plan view of an assembled wire clamp of the present invention.
Figure 4:
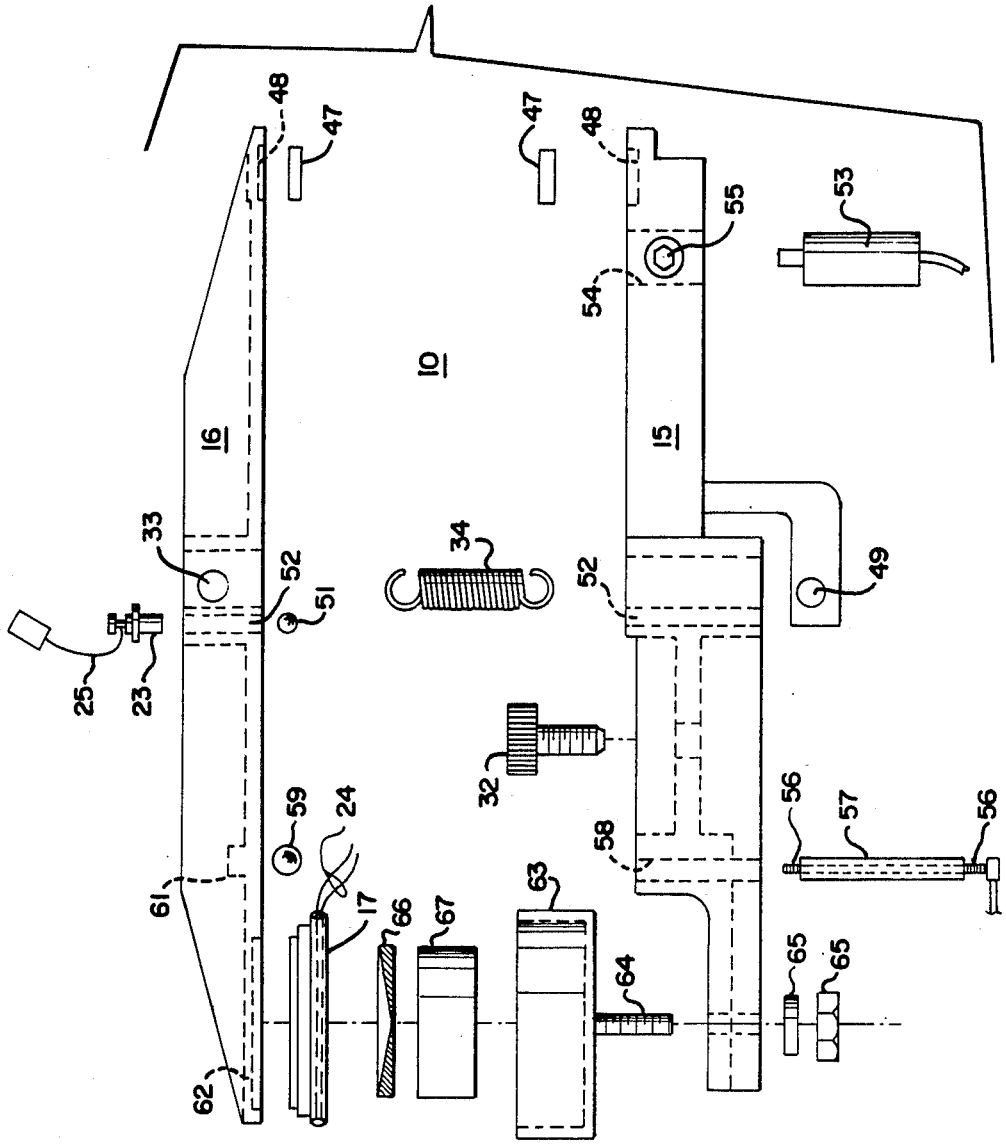
FIG. 4 is an exploded view of the parts of the novel wire clamp shown in FIG. 3.

Refer now to FIGS. 3 and 4 showing in detail the preferred embodiment wire clamp 10. A pair of wire clamp jewels 47 serve as jaws when mounted recesses 48 of the levers 15 and 16. The spring 34 is connected to pin 33 of lever 16 and a pin 49 on an extension of lever 15. The tension spring 34 biases levers 15 and 16 together so that balls 51 are engaged in the ball recess ends of cylindrical apertures 52. The insulating terminals 23 which are connected to the harness 25 are also mounted in cylindrical recess 52 of lever 16. It will be noted that spring 34 is mounted offset from pivot balls 51 so as to cause the wire clamp jewels 47 to be normally biased toward each other.

A wire clamp gap position proximitor 53 is mounted through a cylindrical recess 54 and locked in place by set screw 55. In the preferred embodiment of the present invention the proximitor 53 is a commercially available eddy-current probe which cooperates with a flat surface on lever 16 as its target. However, it should be understood that probes which operate on the principle of capacitance sensing, linear differential variable transformer sensing, light beam reflective sensing and/or ultrasonic sensing could be employed. The jewels 47 forming the jaws for wire clamps 10 are preferably made from synthetic sapphire material when an insulating material is required and made from tungsten carbide when a conductive material is required. An electrical contact 56 is threaded through an insulating sleeve 57 and is preferably mounted through cylindrical recess 58 so that the adjustable probe end 56 cooperates with a conductive contact 59 mounted in a recess 61 of lever 16. The electrical contacts 56 and 59 are preferably employed to determine when the jaws 47 are fully open and when the contacts are normally closed. Such contacts 56 and 59 are capable of indicating when the jaws 47 are not fully open but are incapable of measuring the position of the jaws 47 or the diameter of the wire 18 held therebetween which can be accomplished with the more expensive eddy current probe 53. The low mass voice coil 17 mounts in a recess 62 of lever 16 and is preferably held by a appropriate adhesive. An outer pole piece 63 having a stud 64 is mounted to fixed lever 15 by means of a nut and washer 65. An inner pole piece 66 is adhesively bonded to a magnet 67 which is mounted in and bonded to the bottom of the outer pole piece 63. It will be understood that the movable lever 16 has its mass balanced around a pair of ball pivots 51 so as to reduce the effect of acceleration forces imparted thereto by movement of the X-Y table 28. The spring 34 being offset from the ball pivot 51 biases the jewels 47 to a closed position, however, current applied through electrical connecting wires 24 of voice coil 17 cooperating with magnet 67 can apply additional clamping force or completely open the jaws 47 depending on the magnitude and direction of the current being applied.

Figure 5:
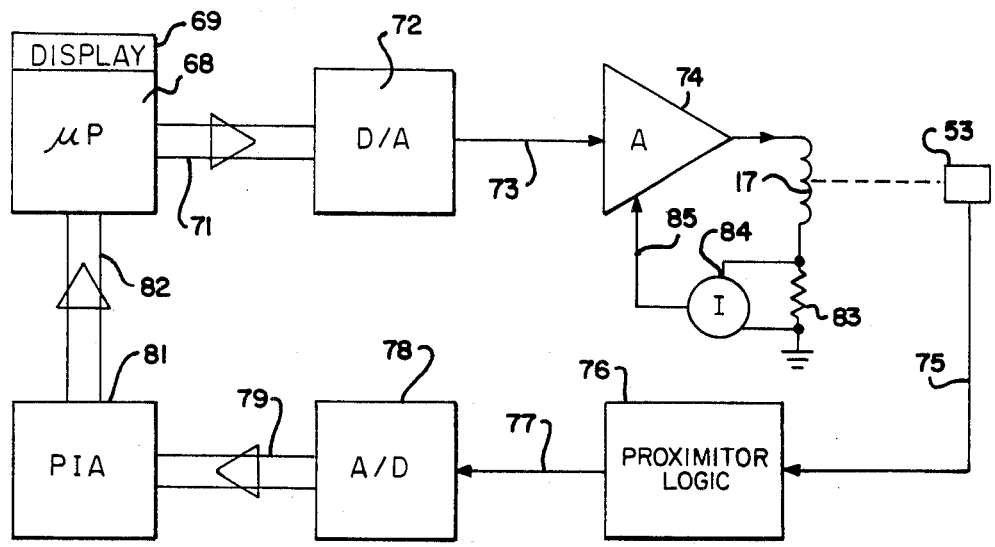
FIG. 5 is a schematic electrical drawing showing a preferred embodiment processor for controlling the force on the voice coil system and also showing a probe for determining the gap in the jaws of the wire clamp.

Refer now to FIG. 5 which is a schematic electrical drawing showing a preferred embodiment processor for controlling the force applied to the jaws 47 by the voice coil 17. The processor controller 68 is provided with a visual display 69. Digital data programmed into the microprocessor 68 is applied over bus 71 to a digital to analog converter 72. The output from converter 72 on line 73 is applied to the voltage to current amplifier 74 having its output connected directly to the voice coil 17. Current applied to voice coil 17 causes the moving lever 16 to pivot about ball pivots 51 and the movement is sensed by wire clamp gap position proximitor 53. The output from proximitor probe 53 is applied on line 75 to the proximitor logic electronics 76 to provide a linear clamp position output on lines 77 to the analog to digital converter 78. The digital output on bus 79 is applied to the peripheral interface adapter 81. The adapter 81 is connected by bus 82 to input ports of the microprocessor controller 68. Current applied by amplifier 74 is sensed by resistor 83 and current sensing device 84 which supplies a feedback signal on line 85 to amplifier 74.

In the preferred sequence of operations no current is applied through the voice coil 17 and the position of the jaws 47 is read by the probe 53. This digital information is stored in the processor controller 68 indicating the closed position of the wire clamps on a wire 18 when the wire is present. If no wire is present the microprocessor senses that the jaws 47 are closed on each other. Further, since the probe 53 is capable of indicating the distance between the jaws 47 it may be employed to sense the wire size between the jaws 47 and display this information on display 69.

In the preferred embodiment voice coil arrangement the force constant of the voice coil motor is known and the force required for holding different size wires in order to facilitate tearing at a bond position is also known. Therefore, once the wire size has been sensed and determined the microprocessor 68 automatically supplies the proper current signal in digital form on bus 71 to apply the proper current force to voice coil 17. In the preferred embodiment explained the force applied to the jaws 47 by coil 17 is always a force predetermined to prevent damage to the wire 18 and ensure that proper clamping and no slippage occurs. During high speed bonding operation it is desirable to only open the jaws 47 sufficient to assure that no drag is imparted to the wire 18. However during a threading or initial set up operation it is desirable to fully open the jaws 47 to provide access for easy threading of the wire 18 through the bonding tool 14.

Figure 6:
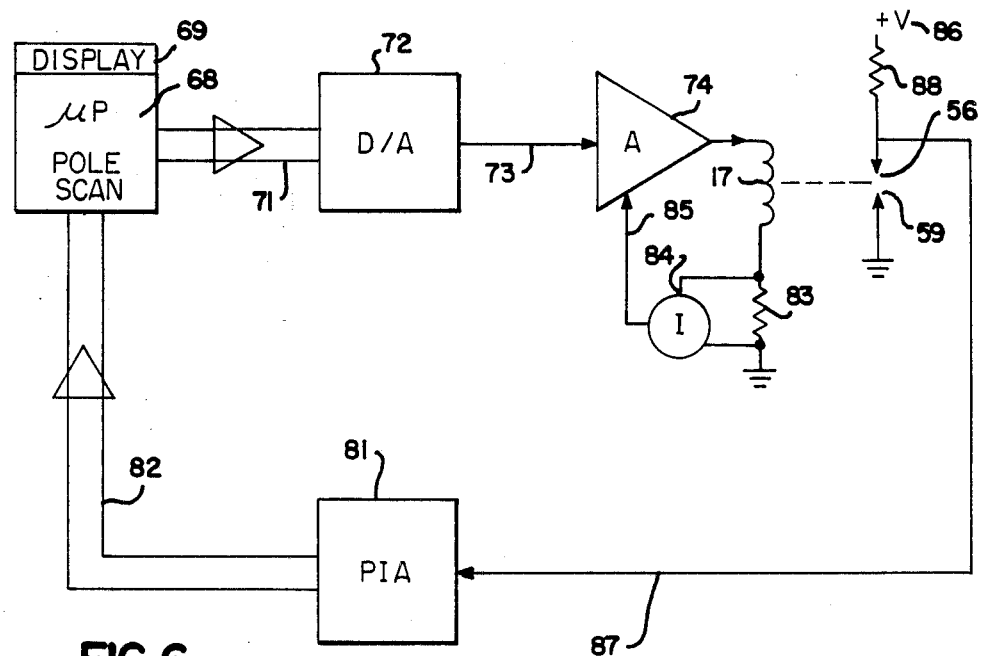
FIG. 6 is a schematic electrical drawing similar to FIG. 5 showing a modified embodiment employing a pair of adjustable contacts instead of a probe.

Refer now to FIG. 6 showing a modified embodiment processor controller 68 for operation with the electrical contacts 56 and 59. The contacts 56 and 59 are normally open when the jaws 47 are engaging a wire during a bonding operation and are normally closed only when the jaws are fully opened for a threading or set up operation. Processor controller 68 and display 69 may be identical to the processor and display explained with reference to FIG. 5 and the bonding force is applied the same way, thus, the elements cooperating with the voice coil 17 may be identical and are numbered the same. The current applied to voice coil 17 is sensed by resistor 83 and sensor 84 to provide a feedback signal on line 85 for determining the force being applied by voice coil 17 the same as has been explained with reference to FIG. 5. When the contacts 56 and 59 are open the voltage source 86 is directly connected to line 86 through resistor 88. However, when the contacts 56 and 59 are closed, as occurs when the jaws 47 are fully open, the voltage 86 is shunted to ground and the voltage on line 87 is shifted from a high state to a low state. The peripheral interface adapter 81 converts this signal to digital data on the input bus 82 to processor controller 68. Thus, it will be understood that the modified embodiment of FIG. 6 is not a substitute for the preferred embodiment shown in FIG. 5 which permits measurement of the distance between the jaws 47 so as to permit monitoring of the distance in the gap between the jaws 47 and the detection of missing wires.

The Z-axis position proximitor 35 produces a signal similar to the signal on line 77 of FIGS. 5 and 6. This signal is fed to the main bonder processor (not shown) of an automatic wire bonder of the type described in U.S. Pat. No. 4,266,710. The vertical or Z-axis movement of the bonding tool and the timing for opening and closing the present invention wire clamps remains substantially unchanged and does not require further explanation herein.

Having explained a preferred embodiment of the present invention it will be understood that the novel voice coil actuated wire clamp is designed to be mounted directly onto the support for a bonding head transducer which is mounted on a X-Y table for movement of the bonding tool. High speed operation of the X-Y table imparts relative movement of the bonding tool to the pads and terminals on a semiconductor device to be bonded in a preferred mode of operation. The present invention wire clamp is capable of maintaining substantially uniform clamping forces to a bonding wire while incuring acceleration forces up to ten times the force of gravity. Since the wire clamp of the present invention is capable of being moved more rapidly without changes in the clamping force, the automatic wire bonder is not limited by the susceptibility of the wire clamp to acceleration forces of the X-Y table.

We claim:

1. An improved bonding head for a high speed automatic wire bonder, comprising:
   a wire bonder housing,
   a bond head frame mounted on said housing,
   a bonding head link pivotally mounted on said bond head frame,
   a transducer mounted on said bonding head link adapted to support a vertically movable bonding tool,
   a first wire clamp lever mounted on said bonding head link,
   a second wire clamp lever pivotally mounted on a pivot on said first wire clamp lever,
   wire clamp jaws at the first ends of the said wire clamp levers,
   spring means biasing said wire clamp jaws to a normally closed position,
   a voice coil motor comprising a voice coil on one of said wire clamp levers and a permanent magnet on the other one of said wire clamp levers at the ends of said levers opposite said wire clamp jaws,
   the mass of said second wire clamp lever being substantially equal on both ends of said lever about said pivot such that the center of gravity of said lever is near said pivot,
   processor control means, and
   amplifier means responsive to said processor control means for applying predetermined currents to said voice coil motor to open and close said wire clamp jaws.

2. A bonding head as set forth in claim 1 which further includes a linear motor coupled to said bond head frame and to said bonding head link for pivoting said bonding head link and for applying a predetermined bonding force.

3. A bonding head as set forth in claim 2 wherein said linear motor comprises a coil mounted on said bonding head link.

4. A bonding head as set forth in claim 3 wherein said linear motor comprises pole pieces and magnets attached to said bond head frame.

5. A bonding head as set forth in claim 1 which further includes indicator means coupled to said processor control means for indicating the distance between said jaws of said wire clamp levers.

6. A bonding head as set forth in claim 1 which further includes a gap probe mounted on one of said wire clamp levers and cooperating with the other of said wire clamp levers, and gap probe logic means coupled to said probe and said processor control means for determining the space between said jaws of said wire clamp levers.

7. A bonding head as set forth in claim 6 wherein said gap probe comprises an eddy current probe sensor.

8. A bonding head as set forth in claim 7 wherein said voice coil of said voice coil motor and said gap probe are coupled to said processor control means in a closed loop and said processor control means are programmable to provide a predetermined gap between said wire clamp jaws on said wire clamp levers.

9. A bonding head as set forth in claim 8 wherein said control means are programmable to provide a predetermined current in said voice coil to provide a predetermined force on a wire in said wire clamp jaws.

10. A bonding head as set forth in claim 6 wherein said processor control means are programmable to detect the presence or absence of a wire in said wire clamp jaws during a bonding operation.

11. A bonding head as set forth in claim 6 wherein said processor control means are programmable to actuate said wire clamp jaws to a wide open position for assisting the feeding of a fine wire from a wire feed to said bonding tool.

12. A bonding head as set forth in claim 1 which further includes an adjustable electrical contact on one of said wire clamp levers cooperating with a fixed electrical contact on the other of said wire clamp levers for determining one of two desired positions of said wire clamp jaws.

13. A bonding head as set forth in claim 12 which further includes means for sensing a closed position of said electrical contacts and an open position of said electrical contacts.

14. A bonding head as set forth in claim 1 which further includes means for sensing the vertical axis position of said bonding tool comprising a sensor mounted on said bond head frame cooperating with a target mounted on said bonding head link.

15. A bonding head as set forth in claim 14 which further includes a Z-axis processor coupled to said means for sensing the vertical axis position of a bonding tool.

16. A bonding head as set forth in claim 15 wherein said means for sensing the vertical axis position comprises an eddy current sensing probe.

* * * * *